United States Patent
Kang et al.

(10) Patent No.: US 10,401,422 B2
(45) Date of Patent: Sep. 3, 2019

(54) CIRCUIT FOR TESTING AND ANALYZING TSV AND METHOD OF TESTING THE SAME

(71) Applicant: INDUSTRY—ACADEMIC COOPERATION FOUNDATION, YONSEI UNIVERSITY, Seoul (KR)

(72) Inventors: Sung Ho Kang, Seoul (KR); Young Woo Lee, Seoul (KR)

(73) Assignee: INDUSTRY—ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 31 days.

(21) Appl. No.: 15/460,488

(22) Filed: Mar. 16, 2017

(65) Prior Publication Data
US 2017/0269150 A1    Sep. 21, 2017

(30) Foreign Application Priority Data
Mar. 18, 2016  (KR) .......................... 10-2016-0032768

(51) Int. Cl.
*G01R 31/28*    (2006.01)
*G01R 31/02*    (2006.01)

(52) U.S. Cl.
CPC ....... *G01R 31/2853* (2013.01); *G01R 31/025* (2013.01)

(58) Field of Classification Search
USPC ....................................... 324/762.01, 762.06
See application file for complete search history.

(56) References Cited

U.S. PATENT DOCUMENTS

| | | | |
|---|---|---|---|
| 8,773,157 B2* | 7/2014 | Badaroglu | G01R 31/318513 324/750.01 |
| 9,318,394 B2* | 4/2016 | Hargan | H01L 22/14 |
| 9,588,174 B1* | 3/2017 | Robertazzi | G01R 31/31715 |
| 9,613,721 B2* | 4/2017 | Kim | G11C 29/82 |
| 9,701,766 B2* | 7/2017 | Abusleme | B01D 71/32 |
| 9,903,910 B2* | 2/2018 | Erickson | G01R 31/02 |
| 2002/0030505 A1 | 3/2002 | Boettler et al. | |
| 2010/0013512 A1* | 1/2010 | Hargan | G01R 31/2853 324/762.02 |
| 2012/0242367 A1 | 9/2012 | Goel | |
| 2013/0021107 A1* | 1/2013 | Poppe | H03K 3/0315 331/57 |

(Continued)

OTHER PUBLICATIONS

Communication dated Aug. 21, 2017 from the Korean Patent Office in a counterpart Korean Patent Application No. 10-2016-0032768.

(Continued)

*Primary Examiner* — Patrick Assouad
*Assistant Examiner* — Demetrius R Pretlow
(74) *Attorney, Agent, or Firm* — Sughrue Mion, PLLC

(57) ABSTRACT

Disclosed are a circuit for testing and analyzing a through-silicon via (TSV) and a method of testing the same. The circuit according to the present disclosure is capable of measuring a voltage applied to a first comparator after passing through a TSV and subsequently determining whether the TSV has a short-circuit fault, measuring the voltage applied to a second comparator after passing through the TSV and subsequently determining whether the TSV has an open-circuit fault, and determining whether the TSV is faulty based on an output from each of the first and second comparators.

7 Claims, 7 Drawing Sheets

(56) References Cited

U.S. PATENT DOCUMENTS

| | | | |
|---|---|---|---|
| 2013/0093454 A1 | 4/2013 | Lai et al. | |
| 2013/0153896 A1 | 6/2013 | Whetsel | |
| 2014/0208279 A1* | 7/2014 | Bhawmik | G01R 31/2853 716/106 |
| 2015/0185273 A1* | 7/2015 | DiRocco | H01L 22/14 324/762.03 |
| 2017/0229190 A1* | 8/2017 | Vogelsang | G11C 29/025 |
| 2018/0106863 A1* | 4/2018 | Whetsel | G01R 31/3177 |

OTHER PUBLICATIONS

Communication dated Apr. 17, 2017 from the Korean Intellectual Property Office in corresponding Korean Patent Application No. 10-2016-0032768.

* cited by examiner

FIG. 5

| | TSV with open-circuit fault (Open) | TSV with short-circuit fault (TSV-to-TSV Bridge) | Normal TSV |
|---|---|---|---|
| Output of first comparator | 0 (Low) | 1 (High) | 0 (Low) |
| Output of second comparator | 0 (Low) | 1 (High) | 1 (High) |
| Output of discriminator | 0 (Low) Fail | 0 (Low) Fail | 1 (High) Pass |

CIRCUIT FOR TESTING AND ANALYZING TSV AND METHOD OF TESTING THE SAME

CROSS-REFERENCE TO RELATED APPLICATION

This application claims the priority benefit of Korean Patent Application No. 10-2016-0032768, filed on Mar. 18, 2016 in the Korean Intellectual Property Office, the disclosure of which is incorporated herein by reference.

BACKGROUND OF THE DISCLOSURE

Field of the Disclosure

The present disclosure relates to a test circuit capable of simultaneously detecting resistive open-circuit and short-circuit faults and analyzing TSV characteristics, and more particularly, to a TSV test circuit which may be included inside a TSV-based chip or in a separate external device.

Description of the Related Art

In a three-dimensional integrated circuit having a test structure capable of selecting a through-silicon via (TSV) with a resistive open-circuit or short-circuit fault, one method of characterizing a TSV is to measure a voltage that has passed through the TSV, calculate the resistance of the TSV, and then digitize the obtained result.

To measure a voltage that has passed through a TSV, a method of connecting the output voltage of the TSV to the input of a comparator and monitoring a section where output voltage transition of the comparator occurs while continuously changing the reference voltage of the comparator is used. The reference voltage value of the comparator at the time when the output voltage transition occurs corresponds to the voltage that has passed through the TSV.

A typical test structure for TSV testing consists of a comparator and a flip-flop, but this test structure can detect only TSV open-circuit faults. Otherwise, when both open-circuit and short-circuit faults are detected, these faults are sequentially tested, and thus test time can be increased in proportion to twice the number of through-silicon vias (TSVs) used in a three-dimensional stacked structure.

After a three-dimensional stacked structure has been formed in a three-dimensional integrated circuit, a test is required to inspect TSVs used in the circuit for a resistive open-circuit or short-circuit fault to determine whether the TSVs can function normally.

In addition to testing TSVs, common TSV analysis requires technologies to characterize TSVs and digitize the obtained results, which may be more important in the early stage of the mass production of a three-dimensional integrated circuit.

A typical test structure capable of analyzing TSV characteristics can detect only TSV open-circuit faults. Otherwise, when both open-circuit and short-circuit faults are detected, these faults are sequentially tested, and thus testing takes a lot of time. As a result, test time can be increased in proportion to twice the number of TSVs used in a three-dimensional stacked structure and test cost can be increased.

SUMMARY OF THE DISCLOSURE

Therefore, the present disclosure has been made in view of the above problems, and it is an object of the present disclosure to provide a circuit capable of simultaneously detecting resistive open-circuit and short-circuit faults, thereby reducing the time and cost for testing a through-silicon via (TSV).

It is another object of the present disclosure to provide a circuit capable of selectively analyzing the characteristics of a normal or faulty TSV and digitizing the obtained results.

In accordance with the present disclosure, the above and other objects can be accomplished by the provision of a circuit for testing and analyzing a through-silicon via (TSV), including a first comparator responsible for measuring a voltage that has passed through a TSV and subsequently determining whether the TSV has a short-circuit fault, a second comparator responsible for measuring the voltage that has passed through the TSV and subsequently determining whether the TSV has an open-circuit fault, and a discriminator responsible for receiving an output from each of the first and second comparators and subsequently determining whether the TSV is faulty.

The circuit for testing and analyzing a TSV according to one aspect of the present disclosure may further include a selector responsible for selecting any one of a test mode in which the circuit is controlled to test whether the TSV is faulty, and a debugging mode in which the circuit is controlled to determine whether a fault occurring in the TSV is a short-circuit or open-circuit fault.

According to one aspect of the present disclosure, the first comparator, to which a voltage that has passed through the TSV and a short-circuit reference voltage for determining whether the TSV has a short-circuit fault are respectively applied, may determine whether the TSV has a short-circuit fault.

According to one aspect of the present disclosure, the second comparator, to which a voltage that has passed through the TSV and an open-circuit reference voltage for determining whether the TSV has an open-circuit fault are respectively applied, may determine whether the TSV has an open-circuit fault.

According to one aspect of the present disclosure, the discriminator may consist of an XOR gate, and may determine that the TSV has an open-circuit fault when the output of the first comparator is 0 and the output of the second comparator is 0.

According to one aspect of the present disclosure, the discriminator may consist of an XOR gate, and may determine that the TSV has a short-circuit fault when the output of the first comparator is 1 and the output of the second comparator is 1.

According to one aspect of the present disclosure, the discriminator may consist of an XOR gate, and may determine that the TSV is normal when the output of the first comparator is 0 and the output of the second comparator is 1.

According to one aspect of the present disclosure, the selector may consist of a MUX and, in the debugging mode, the selector may determine that the TSV has a short-circuit fault when the output of the MUX is 1, and may determine that the TSV has an open-circuit fault when the output of the MUX is 0.

In accordance with an aspect of the present disclosure, the above and other objects can be accomplished by the provision of a method of testing and analyzing a through-silicon via (TSV), the method including a step of measuring a voltage applied to a first comparator after passing through a TSV and subsequently determining whether the TSV has a short-circuit fault, a step of measuring the voltage applied to a second comparator after passing through the TSV and subsequently determining whether the TSV has an open-circuit fault, and a step of determining whether the TSV is faulty based on an output from each of the first and second comparators.

The method of testing and analyzing a TSV according to one aspect of the present disclosure may further include a step of selecting any one of a test mode in which the circuit is controlled to test whether the TSV is faulty, and a debugging mode in which the circuit is controlled to determine whether a fault occurring in the TSV is a short-circuit or open-circuit fault.

According to one aspect of the present disclosure, the first comparator, to which a voltage that has passed through the TSV and a short-circuit reference voltage for determining whether the TSV has a short-circuit fault are respectively applied, may determine whether the TSV has a short-circuit fault.

According to one aspect of the present disclosure, the second comparator, to which a voltage that has passed through the TSV and an open-circuit reference voltage for determining whether the TSV has an open-circuit fault are respectively applied, may determine whether the TSV has an open-circuit fault.

According to one aspect of the present disclosure, the step of determining whether the TSV is faulty may include a step of determining that the TSV is faulty when the output of the first comparator is equal to the output of the second comparator, and a step of determining that the TSV is normal when the output of the first comparator is different from the output of the second comparator.

In accordance with another aspect of the present disclosure, there is provided a method of testing and analyzing a through-silicon via (TSV), the method including a step of selecting any one of test and debugging modes for a TSV, wherein, when the test mode is selected, the method includes a step of measuring a voltage applied to a first comparator after passing through a TSV and subsequently determining whether the TSV has a short-circuit fault, a step of measuring the voltage applied to a second comparator after passing through the TSV and subsequently determining whether the TSV has an open-circuit fault, and a step of determining whether the TSV is faulty based on an output from each of the first and second comparators applied to a discriminator.

In the method of testing and analyzing a TSV according to one aspect of the present disclosure, when the debugging mode is selected, the method may further include a step of determining that the TSV has a short-circuit fault when the output value of the discriminator is 1, and a step of determining that the TSV has an open-circuit fault when the output value of the discriminator is 0.

BRIEF DESCRIPTION OF THE DRAWINGS

The above and other objects, features and other advantages of the present disclosure will be more clearly understood from the following detailed description taken in conjunction with the accompanying drawings, in which:

FIG. 5 is a drawing showing the output results of comparators when a TSV has a resistive open-circuit or short-circuit fault, the output results of comparators when a TSV is normal, and the results of a discriminator to which the output values are applied, according to one aspect of the present disclosure;

DETAILED DESCRIPTION OF THE DISCLOSURE

Figure 1:
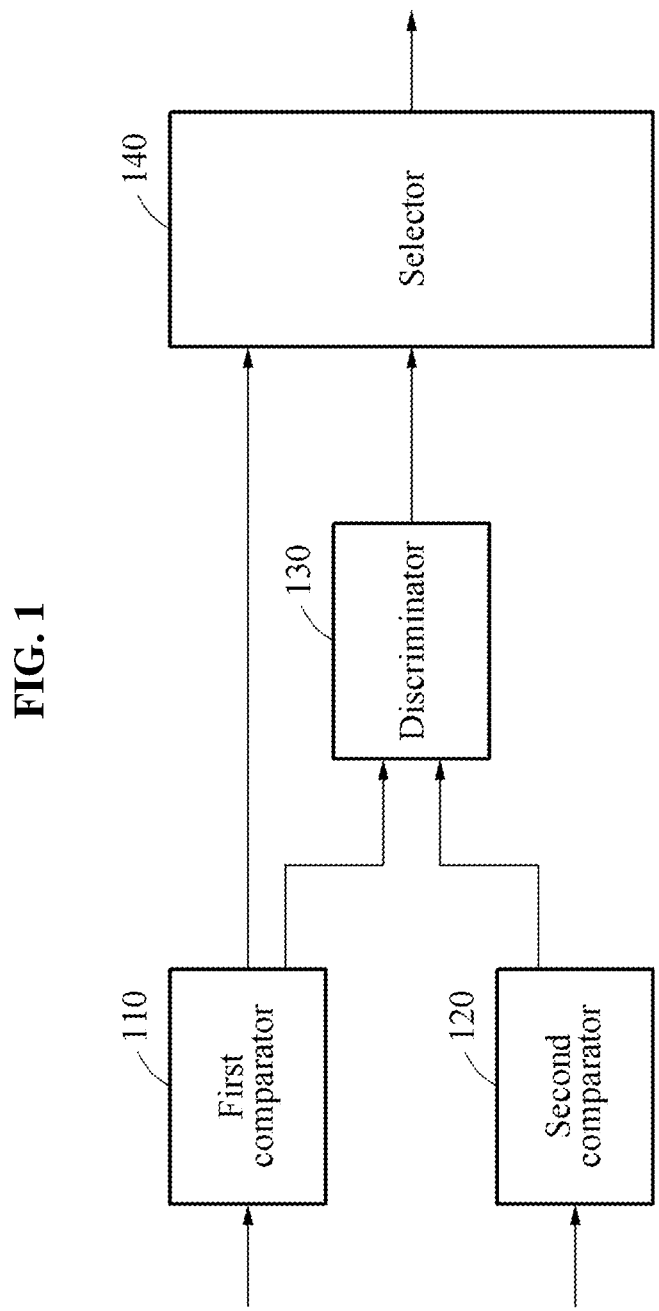
FIG. 1 is a block diagram illustrating the configuration of a circuit for testing and analyzing a through-silicon via (TSV), according to one embodiment of the present disclosure.

Although the embodiments of the present disclosure are described in detail below with reference to the accompanying drawings and the description thereof, specific structural or functional descriptions for the embodiments according to the concepts of the present disclosure disclosed herein are merely illustrative for the purpose of illustrating the embodiments in accordance with the concepts of the present disclosure. Therefore, the embodiments according to the concept of the present disclosure can be implemented in various forms and are not limited to the examples described herein.

The embodiments according to the concept of the present disclosure can be variously modified and can take various forms, so that the embodiments are illustrated in the drawings and described in detail herein. It should be understood, however, that the embodiments according to the concepts of the disclosure are not limited to the specific forms disclosed, but include modifications, equivalents or alternatives falling within the spirit and scope of the disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings according to the concept of the present disclosure.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Other words used to describe the relationship between elements should be interpreted in a like fashion (e.g., "between," versus "directly between," "adjacent," versus "directly adjacent," etc.).

The terms used herein are used for explaining a specific exemplary embodiment, not limiting the present inventive concept. Thus, the expression of singularity herein includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description with reference to the accompanying drawings, the same components are denoted by the same reference numerals regardless of the reference numerals, and a duplicate description thereof will be omitted. In the description of the present disclosure, certain detailed explanations of related art are omitted when it is deemed that they may unnecessarily obscure the essence of the disclosure.

A through-silicon via (TSV) analysis device according to one embodiment of the present disclosure may simultaneously detect the resistive open-circuit and short-circuit faults of a TSV without loss of test reliability, thereby reducing the time and cost for the TSV test.

The TSV analysis device according to one embodiment of the present disclosure is capable of selectively analyzing the characteristics of a normal or faulty TSV and digitizing the obtained results.

FIG. 1 is a block diagram illustrating the configuration of a circuit for testing and analyzing a TSV, according to one embodiment of the present disclosure.

Referring to FIG. 1, the device (or circuit) for testing and analyzing a TSV according to one embodiment of the present disclosure includes a first comparator 110, a second comparator 120, and a discriminator 130.

The first comparator 110 measures a voltage that has passed through a TSV and subsequently determines whether the TSV has a short-circuit fault.

The second comparator 120 measures the voltage that has passed through the TSV and subsequently determines whether the TSV has an open-circuit fault.

The discriminator 130 receives an output from each of the first and second comparators 110 and 120 and subsequently determines whether the TSV is faulty.

The TSV analysis device according to one aspect of the present disclosure may further include a selector 140. The selector 140 may select any one of a test mode in which the device is controlled to test whether a TSV is faulty, and a debugging mode in which the device is controlled to determine whether a fault occurring in a TSV is a short-circuit or open-circuit fault.

In the TSV analysis device according to one aspect of the present disclosure, when a voltage is applied to the input terminal of a TSV, a voltage drop occurs in proportion to the resistance value of the TSV, and based on a voltage that has passed through the TSV, it may be determined whether the TSV has a fault or the characteristics of the TSV may be analyzed.

The circuit configuration of the TSV analysis device according to one aspect of the present disclosure is described below.

Figure 2:
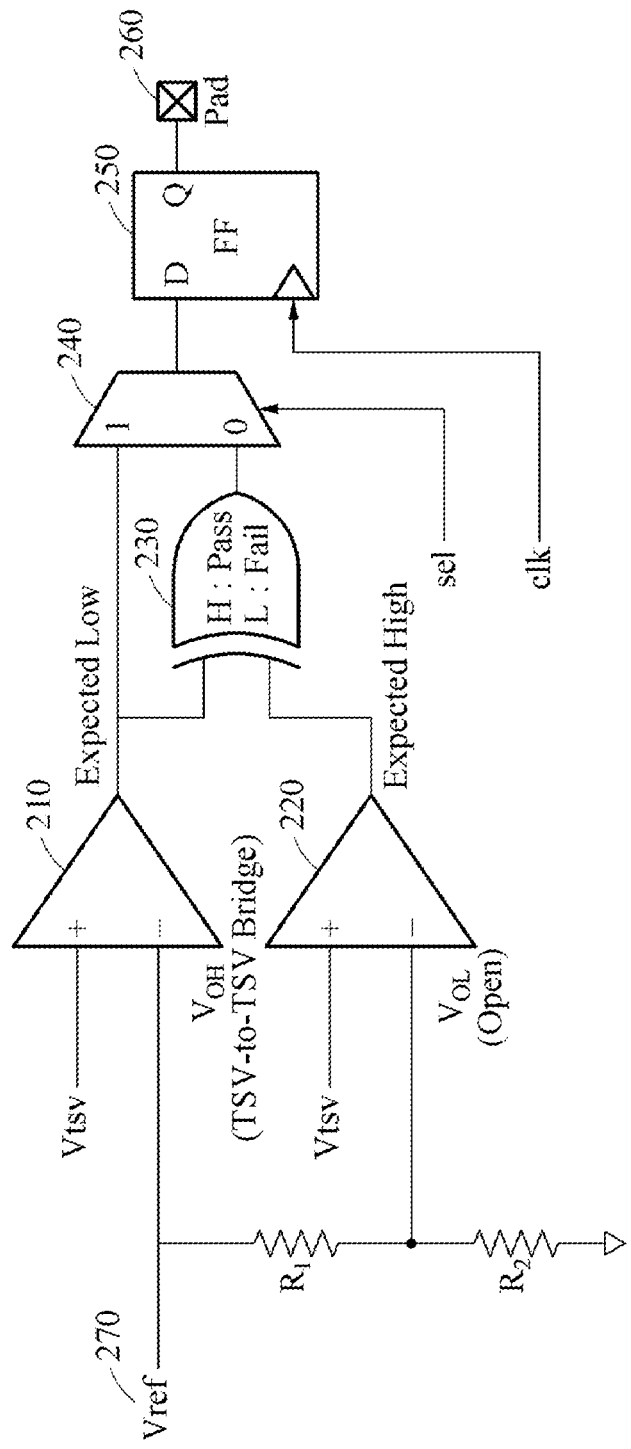
FIG. 2 is a drawing illustrating a circuit for testing and analyzing a TSV, according to one embodiment of the present disclosure.

FIG. 2 is a drawing illustrating a circuit for testing and analyzing a TSV, according to one embodiment of the present disclosure.

Referring to FIG. 2, first and second comparators 210 and 220 may consist of comparators, a discriminator 230 may consist of an XOR gate, and a selector 240 may consist of a MUX, according to one aspect of the present disclosure.

The TSV analysis device according to one aspect of the present disclosure may further include a flip-flop 250 and a pad 260.

Figure 3:
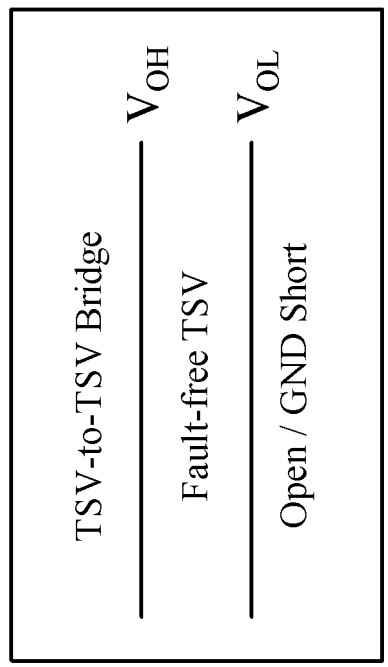
FIG. 3 is a drawing illustrating reference voltage ($V_{OH}$/$V_{OL}$) values used in comparators depending on whether a TSV has a fault and the type of the fault, according to one aspect of the present disclosure.

FIG. 3 is a drawing illustrating reference voltage ($V_{OH}$/$V_{OL}$) values used in comparators depending on whether a TSV has a fault and the type of the fault, according to one aspect of the present disclosure.

Referring to FIG. 3, the comparators may determine that a TSV has a short-circuit fault (TSV-to-TSV Bridge) when a voltage from the TSV is equal to or higher than the specific voltage ($V_{OH}$) with respect to a voltage corresponding to "Fault-free TSV", and may determine that a TSV has an open-circuit fault (Open) when a voltage from the TSV is less than or equal to the specific voltage ($V_{OL}$) with respect to a voltage corresponding to "Fault-free TSV".

The specific voltages ($V_{OH}$/$V_{OL}$) shown in the FIG. 3 may be input to the first and second comparators as reference voltages, respectively.

Referring back to FIG. 2, according to one aspect of the present disclosure, a voltage that has passed through a TSV may be applied to the first and second comparators 210 and 220, and then the voltage may be measured. For example, Vtsv, one of voltages input to the first and second comparators 210 and 220, represents a voltage that has passed through a TSV, and Vref, another voltage, represents the reference voltage of each of the comparators 210 and 220, which is used to determine whether the TSV has a fault.

According to one aspect of the present disclosure, a voltage that has passed through a TSV and a short-circuit reference voltage for determining whether the TSV has a short-circuit fault may be respectively applied to the first comparator 210 to determine whether the TSV has a short-circuit fault.

A voltage that has passed through a TSV and an open-circuit reference voltage for determining whether the TSV has an open-circuit fault may be respectively applied to the second comparator 220 to determine whether the TSV has an open-circuit fault.

According to one aspect of the present disclosure, reference voltages for determining resistive open-circuit and short-circuit faults may be different from each other. For example, as shown in FIG. 2, when only one port is used, for a voltage 270 applied to the one port, the appropriate resistance values of R1 and R2 may be selected in a voltage divider circuit, and reference voltage values required for determining faults may be differently input.

Figure 4:
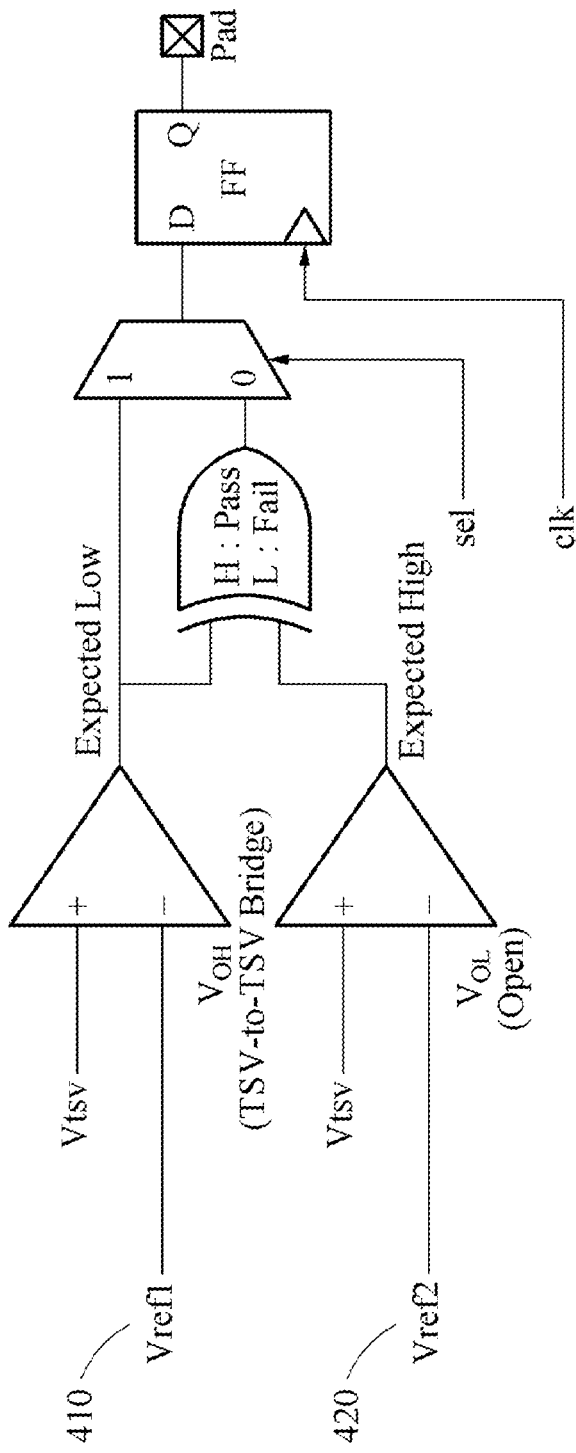
FIG. 4 is a drawing illustrating a circuit for testing and analyzing a TSV, according to another aspect of the present disclosure.

FIG. 4 is a drawing illustrating a circuit for testing and analyzing a TSV, according to another aspect of the present disclosure.

Referring to FIG. 4, when the number of input ports is sufficient, two ports may be used to input different voltages 410 and 420 to each of the ports externally, thereby setting reference voltages for independently determining resistive open-circuit and short-circuit faults.

Referring back to FIG. 2, when a voltage from a TSV is high or low with respect to the reference voltages of the first and second comparators 210 and 220, output values of the first and second comparators 210 and 220 may be 1 (High) or 0 (Low), and the outputs from the first and second comparators 210 and 220 are applied to the input of the discriminator 230 to determine whether the TSV has a fault.

FIG. 5 is a drawing showing the output results of comparators when a TSV has a resistive open-circuit or short-circuit fault, the output results of comparators when a TSV is normal, and the results of a discriminator to which the output values are applied, according to one aspect of the present disclosure.

Referring to FIGS. 2 and 5, when the output of the first comparator 210 is 0 and the output of the second comparator 220 is 0, the discriminator 230 may determine that a TSV has an open-circuit fault. When the output of the first comparator 210 is 1 and the output of the second comparator 220 is 1, the discriminator 230 may determine that a TSV has a short-circuit fault.

When the output of the first comparator 210 is 0 and the output of the second comparator 220 is 1, the discriminator 230 may determine that a TSV is normal.

The selector 240 may allow a user to select a test or debugging mode. The test mode may be set to a default value and change to a debugging mode when the user wants to analyze the characteristics of a TSV. In the debugging mode, the output value of the TSV may be measured, and then the resistance value of the TSV may be calculated or the TSV may be determined to have an open-circuit or short-circuit fault.

To measure the output voltage of a TSV, a method of connecting the output voltage of the TSV to the inputs of the comparators 210 and 220 and monitoring a section where output voltage transition of the comparators 210 and 220 occurs while continuously changing reference voltages in other inputs of the comparators 210 and 220 may be used. The reference voltage value of the comparators 210 and 220 at the time when the output voltage transition occurs may correspond to the voltage that has passed through the TSV.

A method of determining whether the fault of TSV is an open-circuit or short-circuit fault may be performed as follows. When a TSV is determined to be faulty, the mode is changed to a debugging mode, and then the selector 240 may determine that the TSV has a short-circuit fault when an output value is 1 (High), and may determine that the TSV has an open-circuit fault when an output value is 0 (Low).

A method of analyzing a TSV, according to one embodiment of the present disclosure, is described below.

The TSV analysis method according to one embodiment of the present disclosure may be performed using the above-described TSV analysis device, and thus, the method is described focusing mainly on the TSV analysis device.

Figure 6:
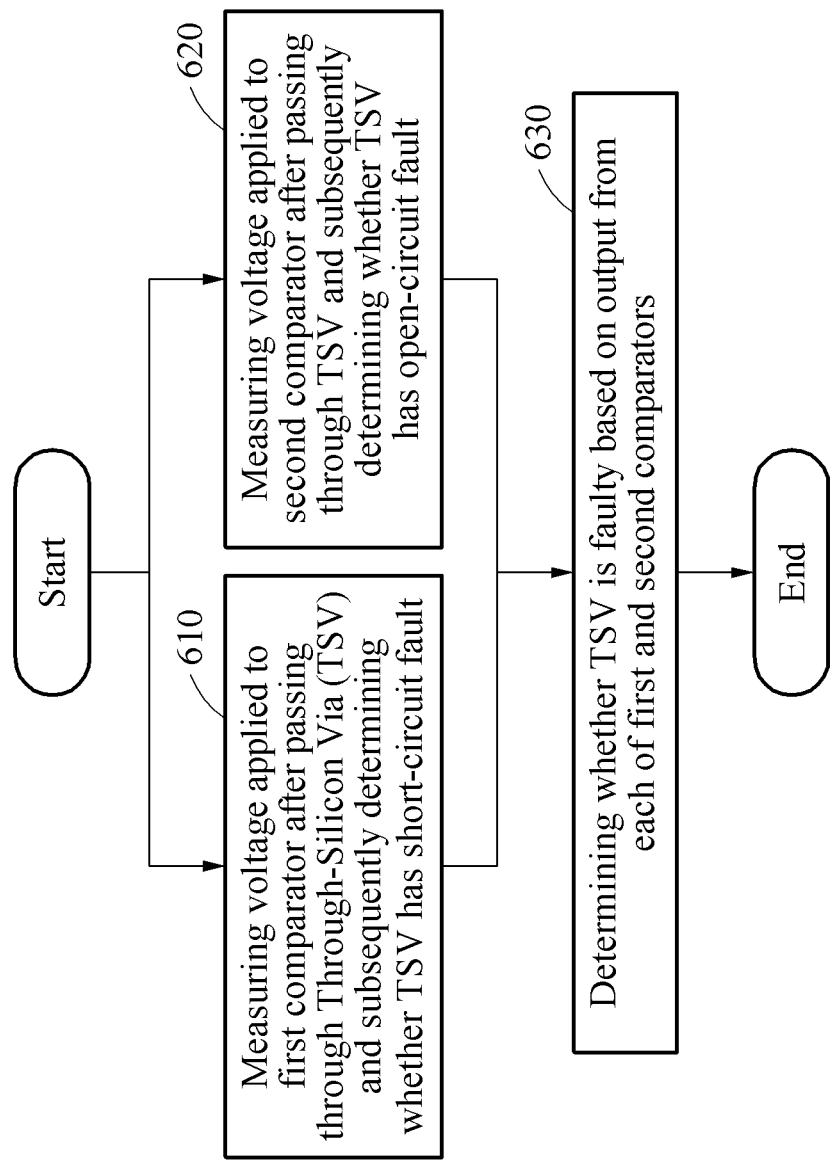
FIG. 6 is a flowchart illustrating a method of testing and analyzing a TSV, according to one embodiment of the present disclosure.

FIG. 6 is a flowchart illustrating a method of testing and analyzing a TSV, according to one embodiment of the present disclosure.

Referring to FIG. 6, the TSV analysis device measures a voltage applied to a first comparator after passing through a TSV and subsequently determines whether the TSV has a short-circuit fault (610).

The TSV analysis device measures the voltage applied to a second comparator after passing through the TSV and subsequently determines whether the TSV has an open-circuit fault (620).

The TSV analysis device determines whether the TSV is faulty based on an output from each of the first and second comparators (630).

The first comparator, to which a voltage that has passed through the TSV and a short-circuit reference voltage for determining whether the TSV has a short-circuit fault are respectively applied, may determine whether the TSV has a short-circuit fault, and the second comparator, to which a voltage that has passed through the TSV and an open-circuit reference voltage for determining whether the TSV has an open-circuit fault are respectively applied, may determine whether the TSV has an open-circuit fault.

The TSV analysis device may determine that the TSV is faulty when the output of the first comparator is equal to the output of the second comparator, and may determine that the TSV is normal when the output of the first comparator is different from the output of the second comparator.

Figure 7:
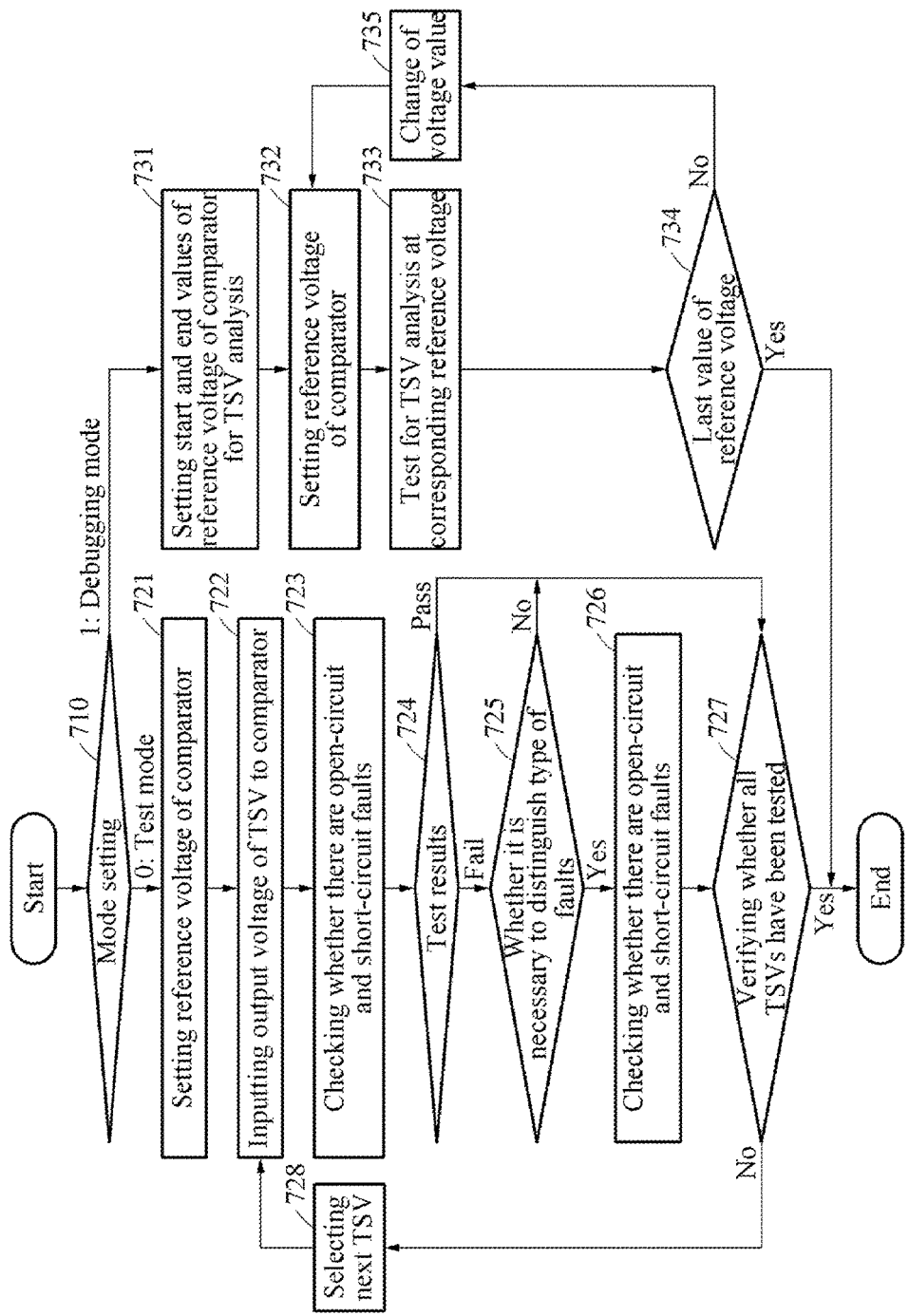
FIG. 7 is a flowchart illustrating a procedure for characterizing a TSV and detecting resistive open-circuit and short-circuit faults, according to one aspect of the present disclosure.

FIG. 7 is a flowchart illustrating a procedure for characterizing a TSV and detecting resistive open-circuit and short-circuit faults, according to one aspect of the present disclosure.

Referring to FIG. 7, a TSV analysis device may select any one of a test mode in which the TSV analysis device is controlled to test whether the TSV is faulty, and a debugging mode in which the TSV analysis device is controlled to determine whether a fault occurring in the TSV is a short-circuit or open-circuit fault (710).

In the TSV analysis device, when the test mode is selected, the reference voltages of comparators for detecting resistive open-circuit and short-circuit faults may be set (721), and the output voltage of a TSV may be applied to the comparators (622).

In the TSV analysis device, the voltage that has passed through the TSV may be input to the comparators to determine whether the TSV is faulty (723).

The TSV analysis device may determine test results (724). When there is no problem with the test results, the test may continue for the next TSV (728). When the TSV is faulty, the device may determine whether the fault is an open-circuit or short-circuit fault (725).

The TSV analysis device may check whether the TSV has open-circuit and short-circuit faults (726). Next, the TSV analysis device may verify that the test has been completed for all TSVs, and when fault classification is complete or when it is not necessary to distinguish the type of faults, the test may be continued in the same way for the next TSV (728).

A debugging mode may be selected when a user wants to analyze the characteristics of a TSV, the TSV analysis device may measure a voltage that has passed through the TSV.

In the debugging mode, the TSV analysis device may set the start and end values of the reference voltages of the comparators for TSV analysis (731), and may set the reference voltages of the comparators (732).

The TSV analysis device may perform a test for TSV analysis at a corresponding reference voltage, and may change a voltage value depending on whether it is the last value of the reference voltage (734 and 735).

For example, the TSV analysis device may measure the output of the second comparator while increasing or decreasing the reference voltages of the first comparator in one direction to measure a voltage. When a transition occurs in the output of the second comparator, the reference voltage of the second comparator may be digitized as a voltage that has passed through the TSV.

Hereinafter, a TSV analysis method according to another embodiment of the present disclosure is described.

A TSV analysis device may select any one of test and debugging modes for a TSV.

When the test mode is selected, the TSV analysis device may measure a voltage applied to a first comparator after passing through a TSV and determine whether the TSV has a short-circuit fault.

The TSV analysis device may measure the voltage applied to a second comparator after passing through the TSV and determine whether the TSV has an open-circuit fault.

The TSV analysis device may determine whether the TSV is faulty based on an output from each of the first and second comparators applied to a discriminator.

When the debugging mode is selected, the TSV analysis device may determine that the TSV has a short-circuit fault when the output value of the discriminator is 1, and may determine that the TSV has an open-circuit fault when the output value of the discriminator is 0.

As described above, the TSV analysis device according to one embodiment of the present disclosure can simultaneously detect the resistive open-circuit and short-circuit faults of a TSV, thereby reducing the time and cost for TSV test.

The TSV analysis device according to one embodiment of the present disclosure is capable of selectively analyzing the characteristics of a normal or faulty TSV and digitizing the obtained results.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, codes, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a signal wave transmitted. The software may be distributed over a networked computer system and stored or executed in a distributed manner. The software and data may be stored in one or more computer-readable recording media.

The methods according to the embodiments of the present disclosure may be implemented in the form of a program command that can be executed through various computer means and recorded in a computer-readable medium. The computer-readable medium can store program commands, data files, data structures or combinations thereof. The program commands recorded in the medium may be specially designed and configured for the present disclosure or be known to those skilled in the field of computer software. Examples of a computer-readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices described above may be configured to operate as one or more software modules to perform the operations of the embodiments, and vice versa.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if substituted by other components or equivalents.

Therefore, other embodiments, other examples, and equivalents to the claims are within the scope of the following claims.

DESCRIPTION OF SYMBOLS

210: FIRST COMPARATOR
220: SECOND COMPARATOR
230: DISCRIMINATOR
240: SELECTOR

What is claimed is:

1. A circuit for testing and analyzing a through-silicon via (TSV), comprising:
    a selector that selects one of a test mode in which the circuit is controlled to test whether the TSV is faulty and a debugging mode in which the circuit is controlled to determine whether a fault occurring in the TSV is a short-circuit fault or an open-circuit fault;
    a first comparator that receives a voltage that has passed through the TSV and a short-circuit reference voltage for determining whether the TSV has the short-circuit fault and compares the voltage and the short-circuit reference voltage;
    a second comparator that receives the voltage that has passed through the TSV and an open-circuit reference voltage for determining whether the TSV has the open-circuit fault and compares the voltage and the open-circuit reference voltage; and
    a discriminator that receives an output from the first comparator and an output from the second comparator and determines whether the TSV is faulty in the test mode,
    wherein, in the test mode, the discriminator determines that the TSV is faulty when the output of the first comparator and the output of the second comparator are the same with each other, and determines that the TSV is normal when the output of the first comparator is different from the output of the second comparator, and
    wherein, in the debugging mode, the discriminator determines whether the TSV has the short-circuit fault or the open-circuit fault based on the output of the first comparator and the output of the second comparator.

2. The circuit according to claim 1, wherein the discriminator consists of an XOR gate, and determines that the TSV has the open-circuit fault when the output of the first comparator is 0 and the output of the second comparator is 0.

3. The circuit according to claim 1, wherein the discriminator consists of an XOR gate, and determines that the TSV has the short-circuit fault when the output of the first comparator is 1 and the output of the second comparator is 1.

4. The circuit according to claim 1, wherein the discriminator consists of an XOR gate, and determines that the TSV is normal when the output of the first comparator is 0 and the output of the second comparator is 1.

5. The circuit according to claim 1, wherein the selector consists of a MUX and, in the debugging mode, the selector determines that the TSV has the short-circuit fault when an output of the MUX is 1, and determines that the TSV has the open-circuit fault when the output of the MUX is 0.

6. A method of testing and analyzing a through-silicon via (TSV) by a circuit for testing and analyzing the TSV, the circuit including a first comparator and a second comparator, the method comprising:

selecting, by the circuit, one of a test mode in which the circuit is controlled to test whether the TSV is faulty and a debugging mode in which the circuit is controlled to determine whether a fault occurring in the TSV is a short-circuit fault or an open-circuit fault;

receiving, by the first comparator, a voltage that has passed through the TSV and a short-circuit reference voltage for determining whether the TSV has the short-circuit fault and comparing, by the first comparator, the voltage and the short-circuit reference voltage;

receiving, by the second comparator, the voltage that has passed through the TSV and an open-circuit reference voltage for determining whether the TSV has the open-circuit fault and comparing, by the second comparator, the voltage and the open-circuit reference voltage;

determining, by the circuit, whether the TSV is faulty based on an output from the first comparator and an output from the second comparator in the test mode; and determining, by the circuit, whether the TSV has the short-circuit fault or the open-circuit fault in the debugging mode, wherein the determining in the test mode comprises:

determining that the TSV is faulty when the output of the first comparator and the output of the second comparator are the same with each other; and determining that the TSV is normal when the output of the first comparator is different from the output of the second comparator, and wherein the determining in the debugging mode comprises:

determining whether the TSV has the short-circuit fault or the open-circuit fault based on the output of the first comparator and the output of the second comparator in the debugging mode.

7. A non-transitory computer-readable recording medium having instructions stored thereon and executed by a processor to perform the method of claim 6.

* * * * *